March 12, 1957 P. EISLER ET AL 2,785,280

PRINTED ELECTRIC CIRCUITS AND ELECTRIC CIRCUIT COMPONENTS

Filed July 23, 1953 2 Sheets-Sheet 1

Inventors
Paul Eisler
Erwin Hauser
By Frederick E. Hane
Attorney

PRINTED ELECTRIC CIRCUITS AND ELECTRIC CIRCUIT COMPONENTS

Inventors
Paul Eisler
Erwin Hauser
By Frederick E. Hane
Attorney

United States Patent Office 2,785,280

Patented Mar. 12, 1957

2,785,280

PRINTED ELECTRIC CIRCUITS AND ELECTRIC CIRCUIT COMPONENTS

Paul Eisler and Erwin Hauser, London, England, assignors to Technograph Printed Circuits Limited, London, England, a British company Application July 23, 1953, Serial No. 369,832

Claims priority, application Great Britain August 8, 1952

5 Claims. (Cl. 219—69)

This invention relates to the manufacture of so-called printed electric circuits and electric circuit components.

One characteristic of such circuits and components is that they consist of or include a thin conductive pattern which is wholly or partly supported and located by an insulating support. In some respects certain known techniques for manufacturing such circuits or components are analogous to techniques employed in the printing industry; hence the name "printed circuits." This name, however, has now been widely adopted to describe any electric circuit or component having the above-mentioned characteristic irrespective of whether or not its manufacture has involved a proper printing or analogous technique. The term "printed circuit" is used in this broad sense in the present specification.

The components referred to are individual or composite components for electric circuits which also possess the said characteristic.

A wide variety of methods have been proposed for producing printed circuits, including direct deposition of the conductive pattern on the support by printing or by stencilling. Other methods include bonding a sheet of conductive foil to a support, imprinting the desired pattern on the foil in an etch-resist, and etching away exposed areas of the foil by chemical or electrolytic etching, or in some cases by alloying, to leave the desired conductive pattern.

The requirements of the finished circuit or component and the nature of the materials from which it is made sometimes impose difficulties and limitations on its manufacture. Thus, the conductive pattern may be required to be of a resistance material or a semi-conductor which cannot easily be treated by a chemical or electrolytic process to the desired accuracy, for instance for the manufacture of components such as special resistors, strain gauges or grids.

For example, for making certain components it may be desirable to use a special bimetallic material such as a thin layer of a noble metal on a support of a base metal. Treating such a material by etching is difficult, since when the etching reagent has slowly eaten away an unwanted area of the noble metal it will preferentially attack the underlying base metal. Moreover, these and other special materials are often available in strip form only in narrow widths, which cannot easily be used in existing printing machines.

Again, where a printing technique is employed for the manufacture of small circuits or components it is often desirable to provide several images of the pattern side by side on the printed plate so that the available width of the printing machine can be used to the best advantage, or because the printing machine may not be capable of handling material of narrow widths. Even if all these images are produced from a single master pattern it is almost impossible to make the multiple images identical, and in consequence there may be undesirable variations in the resulting printed circuits or components.

For certain circuits and components the thickness of the conductive layer may be of importance, and commercially available metal foils sometimes do not have sufficient uniformity of thickness to enable them to be used as the conductive layer without further treatment to ensure greater uniformity of thickness. Again, it is sometimes desirable to reduce the thickness of the whole or parts of a metal foil, even if it is of uniform thickness at the start.

The present invention aims at providing a new method for manufacturing printed circuits and circuit components which is capable of employment where difficulties of the kind referred to would attend the manufacture of the circuit or component by one of the known methods.

According to the present invention a method of manufacturing a printed electric circuit or electric circuit component comprises removing unwanted parts of the material from which the circuit or component is to be formed, by an electric spark erosion process as hereinafter defined.

For making a conductive pattern of metal foil the method comprises completely removing unwanted areas from a sheet or strip of the metal foil by this electric spark erosion process. A useful application of the invention is to the manufacture of printed circuits or circuit components from a metal foil forming one layer of a bimetal strip or sheet. In this case the method may comprise patterning the foil by the spark erosion process, uniting the patterned side of the bimetal to an insulating body, and then removing at least a part of the other layer of the bimetal to expose at least a part of the patterned foil.

In an alternative method, one layer of the bimetal is a metal which is unaffected by an agent, such as an etching liquid, which will remove the other metal of the bimetal, the first mentioned layer is formed into a pattern by the spark erosion process, and the bimetal is subjected to treatment with the said agent to remove those parts of the second layer not protected by the pattern of the first layer. Thus the pattern is imparted also to the second layer.

For making conductive patterns from a foil, one form of the invention comprises mounting the foil upon a temporary conductive support, removing the unwanted areas of the foil by the electric spark erosion process, transferring the pattern thus formed to an insulating support, and removing at least a part of the temporary conductive support.

The electric spark erosion process referred to above is a process similar to that which has been suggested for removing material from unmachinable or difficultly machinable substances, such as hard carbides which are used as tool tips, drawing dies and the like. The process comprises bringing electrode into close proximity to the substance to be eroded while the substance and the electrode are immersed in a dielectric liquid, and passing a very rapid succession of pulses of a uni-directional electric current across the gap between the electrode, which is connected as the cathode, and the substance to be eroded, which is connected as the anode, to produce a spark discharge between them, which has the effect of dislodging minute particles of the substance which are carried away by the dielectric liquid. The effect produced is somewhat analogous to the removal of material in a grinding or similiar machining operation. The length of the spark gap is highly critical, enabling the parts of material to be removed to be accurately predetermined by localising the sparking, for instance by the use of a suitably shaped electrode.

In applying this process to the manufacture of printed circuits and components the material from which the printed circuit or component is to be formed is connected to the positive terminal of the electricity supply, and an electrode connected to the negative terminal is brought into close proximity with the surface of the said material in the presence of a dielectric liquid so that spark discharges will occur between the electrode and the circuit material, resulting in the erosion of unwanted parts of the latter. Various ways in which the invention may be performed will now be described by way of example with reference to the accompanying diagrammatic drawings in which:

Figures 1, 2, 3, 4, 5:
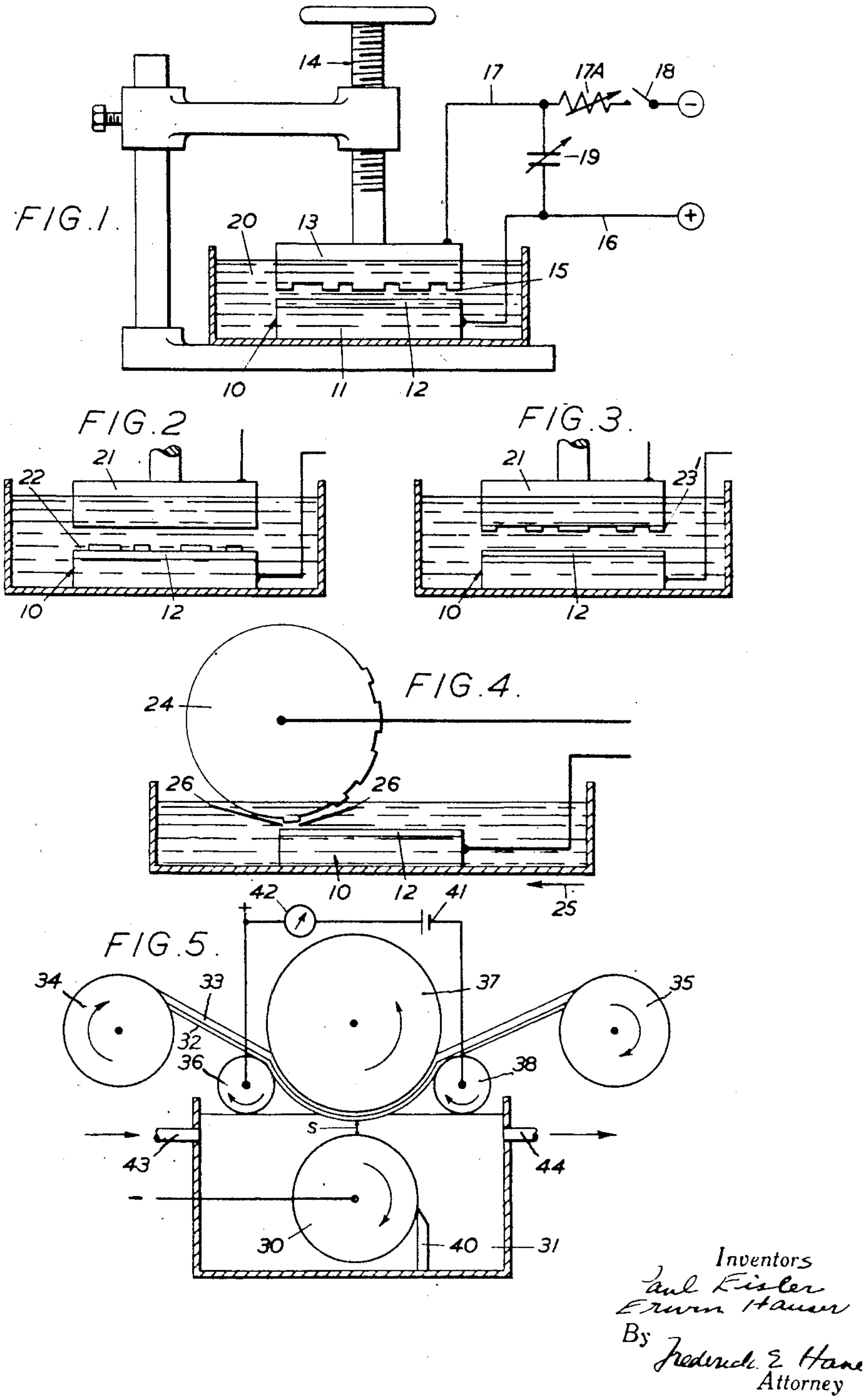
Figure 1 illustrates a way of performing the invention for producing a conductive pattern, using a specially shaped cathode.
Figure 2 illustrates a way of performing the invention for producing a conductive pattern, using a plain cathode.
Figure 3 illustrates another way of performing the invention for producing a conductive pattern, using a plain cathode.
Figure 4 illustrates a way of performing the invention for producing a conductive pattern, using a roller cathode.
Figure 5 illustrates a way of performing the invention for reducing the thickness of a layer of metal foil while controlling the operation automatically.

In the arrangement shown in Figure 1, the anode 10 consists of a block of conductive material 11 carrying on its surface a thin layer 12 of the material from which the conductive pattern is to be formed. This will usually be a thin sheet of metal foil.

The cathode 13 is mounted on mechanism 14, whereby its height in relation to the anode 10 can be accurately adjusted.

The lower surface 15 of the cathode is patterned with a relief negative image of the desired pattern to be imparted to the foil layer 12.

The anode 10 is connected by a lead 16 to the positive terminal of a source of direct current, while a lead 17 from the cathode is connected to the negative terminal.

An interrupter 18 is provided in one of the leads, for providing rapid interruptions in the current. A condenser 19 is connected across the leads. A resistance 17A is provided in one of the leads, for effecting rapid re-charging of the condenser 19. The values of the resistance 17A and the condenser 19 can be varied over a wide range.

The cathode and the anode are immersed in a bath 20 of a dielectric liquid. The bath is made of insulating material.

In operation the cathode is advanced towards the anode until sparking occurs between the projecting portions of the cathode surface 15 and the adjacent areas of the anode. This sparking erodes the foil 12 in these areas, the eroded metal being carried away in the dielectric liquid, and eventually leaving on the block 11 a conductive pattern of the desired circuit or component.

An alternative method is to use a plan cathode 21 as shown in Figures 2 and 3 and to arrange between the electrodes a pattern layer of material which differentiates the breakdown value of the gap in the areas which are to be removed from that in the areas which are to remain.

In the arrangement shown in Figure 2, the interposed material is one which raises the break-down value of the gap and thus inhibits sparking in the areas in which it is present. Accordingly this layer of material 22 should be present over the areas which are to form the desired pattern. It may be applied to the foil 12, as shown, or to the cathode 21.

This layer 22 must be an insulator and may, in certain conditions, also act as a spacer between the foil and the cathode, in which case the foil and the cathode are pressed together with the spacer between them. Provision must be made for the effective circulation of the liquid, for instance through holes in the cathode.

In the arrangement shown in Figure 3, the interposed material is one which lowers the break-down value of the gap and thus facilitates sparking in the areas in which it is present. Accordingly this layer of material 23 should be applied to the cathode as a negative image of the desired pattern, i. e. over the areas which are to be removed.

A certain amount of erosion of the cathode occurs, and an advantage of the arrangements shown in Figures 2 and 3 is that a plain cathode is employed which is generally cheaper to replace than a specially shaped cathode as employed in Figure 1.

It is not necessary to treat the whole of the foil layer 12 simultaneously, since the cathode can be arranged to sweep the surface of the foil layer so that a line or small area of sparks traverse it, for instance, by arranging the cathode in the form of a roller 24 as shown in Figure 4, which is suitably patterned to ensure that sparking occurs in the desired areas only. If desired, the roller 24 may be arranged to revolve about a stationary axis while the anode 10 is advanced transversely relatively to the axis in the direction of the arrow 25. Alternatively the anode may remain stationary and the roller be advanced. Shields 26 may be provided for confining the sparking strictly to the desired zone, to avoid any risk of "fogging" the edges of the pattern.

Instead of shaping the roller surface in the desired pattern, a patterned layer of material which differentiates the breakdown value of the spark gap may be applied to a roller having a plain surface. Alternatively, such a layer may be applied to the foil 12, as shown in Figure 2. In this event the roller 24 may be replaced by a cathode in the form of a straight-edge or a point, which is arranged to traverse the whole anode in a sweep or a series of sweeps.

Where the pattern of the required circuit or component is a coherent one, that is to say all its parts are connected together, it may in some cases suffice to connect the conductive layer 12 directly to its terminal, so that the pattern can be formed when the conductive layer is already secured to a permanent insulating support. It is generally preferred, however, to mount the conductive layer on a temporary conductive support such as 11 which maintains all parts of the conductive layer 12 in electrical connection with the terminal even though they may otherwise be isolated from other parts of the conductive layer. Thus the conductive layer 12 and its support 11 may be in the form of a bimetal strip. For instance the layer 12 may be a thin layer of a noble metal applied to a thicker layer of a base metal such as copper. When the erosion of the conductive layer 12 is complete, that is to say, when the material of this layer has all been eroded away in the unwanted areas, the resulting pattern is then transferred to an insulating support, for instance by stoving on a lacquer layer, or by sticking it to the surface of an insulator, or by embedding it in the surface of a mouldable insulator in a moulding operation. The temporary support for the pattern can then be removed in any suitable manner, for instance by a selective etching treatment with an etching reagent which will dissolve the temporary support but not the pattern itself, or by a combination of a selective etching treatment and a spark erosion process, or by a spark erosion process alone, or by a stripping operation in cases where the temporary support is secured to the conductive layer by a disruptable bond.

In the arrangements so far illustrated the purpose of the erosion process has been to produce a conductive pattern. As indicated earlier, however, the invention is also applicable to the erosion of metal foils either for correcting inequalities of thickness or for reducing the thickness of a foil layer. An apparatus for this purpose is shown in Figure 5. In this apparatus the cathode is in the form of a roller 30 immersed in a bath 31 of a dielectric liquid. The anode is a layer of metal foil 32 carried on an insulating backing 33, for instance a layer of paper, plastic, or solidified lacquer. The anode band is unrolled progressively from a spool 34 and is wound on a spool 35. Between the spools it first passes over a metal guide roller 36 which is in contact with the foil layer 32, then under a roller 37 which is in contact with the backing 33, and then over another metal roller 38 which is in contact with the foil layer 32. Between the rollers 36 and 38, the foil layer 32 dips into the liquid in the bath 31 and approaches close to the cathode roller 30, the space between the foil layer 32 and the roller 30 constituting the spark gap.

A doctor blade 40 scrapes the surface of the cathode 30 to remove from it any impurities such as particles of metal which may be deposited thereon.

The positive connection to the metal foil layer 32 is conveniently made through one of the metal rollers which is in contact with it, for instance, the roller 36.

The length of the foil band between the rollers 36 and 38 is constant and therefore (assuming uniform width) the electrical resistance of this length of the foil will be a function of its thickness. This electrical resistance can be measured by connecting between the rollers 36 and 38 a source of current 41 and an ohm meter 42. The reading of the ohm meter thus provides a measure of the average thickness of the metal foil between the rollers 36 and 38. If it is found that the resistance is too low, it means that the foil is too thick, and in consequence the rate of erosion should be increased. The rate of erosion, and the starting and stopping of the sparking, can be controlled either by adjusting the length of the spark gap or the spark current or the voltage. By connecting the ohm meter 42 to suitable servo-mechanisms, one or more of these variables can be adjusted automatically so that the apparatus is self-regulating.

It is in many cases desirable to provide a forced circulation of the dielectric liquid through the spark gap, and one way of achieving this is to provide a continual flow of the liquid through an inlet 43 while withdrawing a corresponding quantity through an outlet 44. It will be appreciated that this feature may be applied to any of the other arrangements described. In this case the cathode is arranged below the anode. This is purely a matter of convenience; the relative dispositions of the cathode and anode do not materially affect the process.

Figure 6:
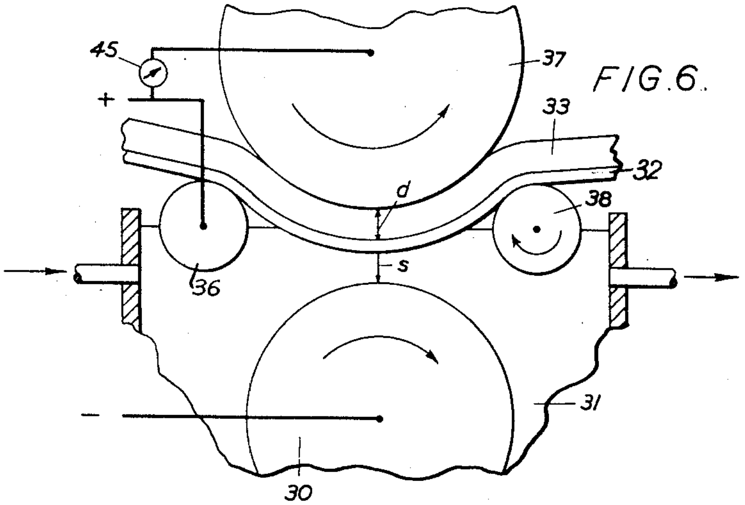
Figure 6 illustrates a way of controlling the erosion of a sheet of metal foil supported on an insulated backing the thickness of which may vary.

Another apparatus is illustrated in Figure 6. In this apparatus many of the parts are similar to those shown in Figure 5, and such parts have been given the same reference numerals as in Figure 5. The apparatus of Figure 6 is founded on the appreciation that if the thickness of the backing 33 should vary it will alter the length of the spark gap, unless some system of correction is employed. Such a system is shown in Figure 6, in which the thickness of the insulating backing 33 represented by the distance *d* is measured by ascertaining the capacitance which exists between the roller 37 (which in this case is conductive) as one electrode and the foil layer 32 as the other electrode through the dielectric represented by the backing 33. This capacitance can be measured by connecting a suitable instrument 45 between the lead to the roller 36 (or a similar lead to the roller 38) and the conductive roller 37. If the thickness *d* should increase, the capacitance will be reduced, and vice versa. Thus the reading of the instrument 45 provides a measure of the dimension *d*. The reading of the instrument 45 may be connected to a servo mechanism controlling the position of the cathode roller 30 or of the roller 37 so that the distance between the axis of the roller 30 and the axis of the roller 37 is adjusted to compensate for the changes in the dimension *d*. Thus the spark gap distance *s* is maintained constant. If desired, such a control system may be employed in conjunction with a control system such as that shown in Figure 5.

It will be appreciated that similar control systems can be applied to other forms of the apparatus, such as those shown in earlier figures.

Figure 7:
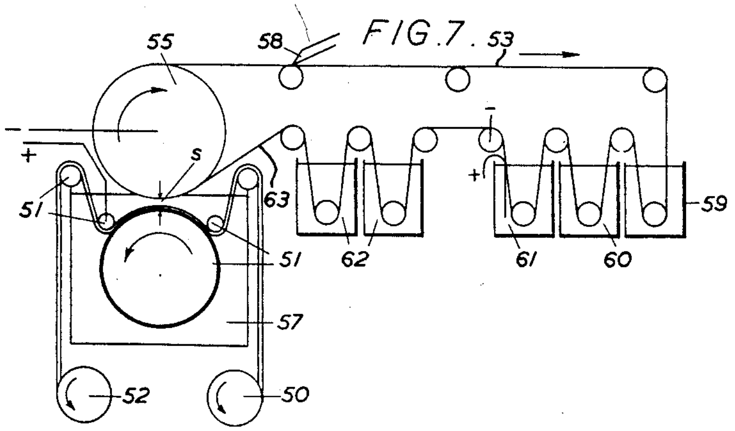
Figure 7 is a diagram of an apparatus for producing repeats of a circuit pattern.
Figure 8:
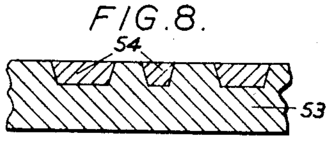
Figure 8 is a section through part of the cathode band employed in the apparatus of Figure 7.

For providing a repeat pattern on a long strip of metal foil carried on a backing, an apparatus such as that shown in Figure 7 may be employed. In this apparatus a metal foil strip carried on an insulating or other backing is reeled off from a spool 50, and is passed around guide rollers 51 on to a take-up spool 52. One of the rollers 51 which contacts the metal foil side of the strip may be used as the anode connection, as in Figures 5 and 6. The cathode is in the form of a continuous band of metal 53 having those parts of its surface which correspond to the desired circuit pattern counter-sunk and filled with a suitable enamel, as shown at 54 in Figure 8. The band 53 passes over a roller 55 connected as the cathode, the lowest portion of which is spaced from the foil band by a distance *s* to constitute the spark gap. The spark gap is immersed in a bath of dielectric liquid 57. The band 53 is advanced uniformly with the advance of the metal foil strip, and, as it passes close to the metal foil strip, sparks jump across the gap from the bare portions of the band 53, i. e. those portions which do not contain the enamel inserts 54. Erosion of parts of the foil layer thus occurs, leaving an uneroded pattern on the foil corresponding to the pattern of the enamel inserts on the band 53.

On leaving the roller 55, the band 53 passes under a doctor blade 58 which scrapes from it any matter which may have been deposited on its surface or any loose particles of corroded metal. The band 53 now passes over guide rollers and into an etching bath 59 which slightly etches away portions of the metal surface between the enamel inserts, so as to undercut the surface of the metal to below the level of the enamel surface. After passing through the etching bath 59 the band passes through a cleaning bath 60, or through a series of such cleaning baths. The cleaned and slightly undercut band 53 then passes through a plating bath 61 where metal is electroplated on to it again. The plating conditions are so adjusted that the deposited metal affords a surface which is again flush with the surface of the inserts 54. After re-plating, the band passes through further cleaning baths 62 then over a wiper 63, and finally passes back over the roller 55, whereupon the process is repeated. A repeat of the pattern is thus provided on the foil strip.

Since the length of the circuit pattern will in general be only a small fraction of the length of the band 53, this band will normally be provided with several repeats of the same pattern, or in some cases it may be provided with several different patterns.

Figure 9:
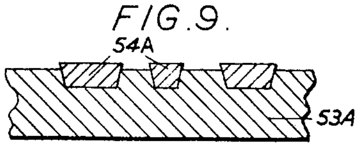
Figure 9 is a view similar to Figure 8, showing a modified form of cathode band.

In the modification shown in Figure 9, the inserts 54A stand proud of the band 53A at all times, and the projecting parts may act as spacers to determine the length of the spark gap. Unless the inserts 54A are arranged in lines running lengthwise along the band, the doctor blade 58 must be replaced by other means for scraping the metal surface of the band.

The method described for thinning the surface of a metal foil is not confined to thinning a metal foil prior to the production of a printed circuit pattern, since this could be done after the formation of a pattern if preferred. Such arrangements, however, are less easy to control automatically than are arrangements in which the whole of a band of foil of uniform width is thinned. Also, the method of thinning can be used not only for treating the layer of foil which is to form the desired pattern, but also for removing a metallic backing from a bimetal strip after the formation of the circuit pattern and the embedding of this pattern in an insulating support.

The invention may also be used as a step in the manufacture of patterns from metal foil by an etching process. One printed circuit method for making patterns from foil is to provide on the surface of the foil is a resist layer of the desired pattern, which protects the foil from the action of the etching agent in the areas where the resist is present. It is sometimes desirable to use as the resist a thin film of a metal which is different from the metal of the foil and which is not affected by the etching agent. One difficulty about such resists is that it is difficult to pattern the resist itself by a metal removal process, since any agent which will attack the resist metal will generally attack the foil metal also.

In applying the present invention to this problem, a thin film of resist metal (for instance silver) is applied over the surface of the foil metal (for instance copper). The desired pattern can then be formed in the resist metal by the spark erosion process. It does not matter if a certain amount of erosion of the underlying foil metal occurs also. The side of the foil opposite to that bearing the resist is protected by suitable means, for instance by being bonded to an insulator, and the foil is then treated by the etching agent. This removes the areas of the foil not protected by the resist, bearing the desired pattern of foil. This method is suitable for the manufacture of all kinds of foil patterns, including patterns of fine conductors such as coils.

As indicated above, it is desirable to provide a flow of the dielectric liquid and an arrangement has been described for performing this. However, other means may be used for providing a flow of liquid at the spark gap. For instance, a jet of the liquid may be played upon the spark gap.

Arrangements may be made for recovering the eroded metal from the bath. This is particularly the case where the metal eroded is a valuable noble metal such as gold.

It will be appreciated that the drawings are highly diagrammatic and are not to scale. For instance, the foil layer 12 or 32 will usually be very thin, say not more than a few thousandths of an inch thick, while the layers 22 (Figure 2) and 23 (Figure 3) would be of similar thickness. However, the invention is not confined to the treatment of very thin foils, since it can also be employed for treating thicker conductive layers if desired.

Among the advantages of the invention are that it enables a multiplicity of circuits or components to be produced quickly and with high definition and accuracy from a single master pattern, and from material which may be available only in the form of narrow strips and which may be difficult to treat by more normal methods. However, although the invention is applicable more particularly to the manufacture of printed circuits and components where special problems would otherwise arise, it is to be understood that the process is not confined to such cases and may equally well be used for the manufacture of printed circuits or components where the conductive layer is of a material amenable to more normal treatment.

What we claim as our invention and desire to secure by Letters Patent is:

1. A method of manufacturing the conductive pattern of a printed circuit product, which comprises subjecting a strip of insulation backed metal foil which may vary in thickness to a spark erosion process for removing areas of the foil other than those forming part of the pattern, measuring the capacitance of the backing between the foil and a supporting conductor applied to the opposite side of said backing, at a point adjacent to the spark gap, and adjusting the distance between said supporting conductor and the electrode employed in said spark erosion process in dependence on the capacitance measurement, so as to provide a spark gap of substantially constant length.

2. A method of manufacturing the conductive pattern of a printed circuit product which comprises the steps of immersing a strip of insulation backed conductive material from which the pattern is to be formed and an electrode in a dielectric liquid, bringing said material and said electrode into close proximity at places where parts of the material are to be removed to form said pattern, applying to said electrode and said material a potential causing a spark discharge across the gap between the electrode and the respective parts of the material for eroding the said parts of the conductive material by said discharge, adjusting the thickness of said strip of conductive material by measuring an electrical characteristic of said strip which is a function of its thickness immediately after said spark erosion process, and controlling the spark in accordance with said measuring in the sense to increase the rate of erosion where the measuring shows an increased thickness.

3. A method as claimed in claim 2, in which said electrical characteristic is the resistance of the strip.

4. A method of manufacturing a conductive pattern of a printed circuit product which comprises the steps of immersing a bimetal strip from which the pattern is to be formed and an electrode in a dielectric liquid, bringing one layer of said strip and said electrode into close proximity at places where parts of said layer are to be removed to form said pattern therefrom, applying to said electrode and said strip a potential causing a spark discharge across the gap between the electrode and the respective parts of the respective layer for eroding the said layer by said discharge thereby forming the pattern from the respective layer, adhering the patterned layer to an insulation backing and removing at least partly the non-patterned layer of the strip to expose the respective parts of the insulation backed patterned layer.

5. A device for manufacturing the electrically conductive pattern of a printed circuit product from a strip of insulation backed conductive material, the said device comprising a receptacle for a dielectric liquid, support means for supporting the conductive material, electrode means disposed in close proximity with said support means to form a spark gap between said electrode means and a part of the conductive material to be removed to form said pattern, said support means and said electrode means being disposed for immersion in dielectric liquid contained in said receptacle, a source of a potential higher than the breakdown potential of said gap connected with said electrode means and said conductive material in a circuit including said gap, and circuit control means connected with said circuit for passing a succession of pulses of said potential across said gap to erode by spark discharges said parts to be removed from the conductive material, and measuring circuit means connected with the conductive material and the electrode means for measuring an electrical characteristic of the conductive material which is a function of the thickness of the strip immediately after the spark erosion, said measuring circuit means controlling the spark so as to increase the rate of erosion in response to an increased thickness.

References Cited in the file of this patent

UNITED STATES PATENTS

| | | |
|---|---|---|
| 2,385,246 | Wilsey et al. | Sept. 18, 1945 |
| 2,388,069 | Meaker et al. | Oct. 30, 1945 |
| 2,441,960 | Eisler | May 25, 1948 |
| 2,458,871 | Oles | Jan. 11, 1949 |
| 2,481,951 | Sabee et al. | Sept. 13, 1949 |
| 2,628,330 | Williams | Feb. 10, 1953 |
| 2,637,766 | Grouse | May 5, 1953 |
| 2,683,792 | Dubilier | July 13, 1954 |

FOREIGN PATENTS

| | | |
|---|---|---|
| 637,793 | Great Britain | May 24, 1950 |